US008169705B2

(12) United States Patent
Cangemi et al.

(10) Patent No.: US 8,169,705 B2
(45) Date of Patent: May 1, 2012

(54) DENSE HOMOGENEOUS FLUORIDE FILMS FOR DUV ELEMENTS AND METHOD OF PREPARING SAME

(75) Inventors: Michael J Cangemi, Victor, NY (US); Horst Schreiber, Rochester, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 395 days.

(21) Appl. No.: 12/277,596

(22) Filed: Nov. 25, 2008

(65) Prior Publication Data

US 2009/0141358 A1 Jun. 4, 2009

Related U.S. Application Data

(60) Provisional application No. 61/004,784, filed on Nov. 30, 2007.

(51) Int. Cl.
*G02B 1/10* (2006.01)
(52) U.S. Cl. ........................................ 359/586
(58) Field of Classification Search .......... 359/586–588; 355/53
See application file for complete search history.

(56) References Cited

U.S. PATENT DOCUMENTS

| 4,783,373 | A | 11/1988 | Baumeister et al. | |
| 4,934,788 | A | 6/1990 | Southwell | |
| 6,611,378 | B1* | 8/2003 | Wang et al. | 359/588 |
| 2003/0227670 | A1* | 12/2003 | Taki | 359/355 |
| 2005/0018301 | A1* | 1/2005 | Uehara | 359/586 |
| 2005/0280890 | A1* | 12/2005 | Otani et al. | 359/359 |
| 2006/0262389 | A1* | 11/2006 | Zaczek | 359/359 |
| 2007/0236799 | A1* | 10/2007 | Tateno | 359/588 |

FOREIGN PATENT DOCUMENTS

| EP | 0855604 A1 | 7/1998 |
| EP | 1312586 A1 | 5/2003 |

OTHER PUBLICATIONS

McEldowney S et al.; "Intrinsic Stress in Mixtures of Fluoride Thin Films"; Proceedings of Optical Interference Coating Conference; Jan. 1995; pp. 269-271.
Japanese Abstract for 2004260080, Published on Sep. 16, 2004; Kokubu Takao.
Japanese Abstract for 2001194526, Published on Jul. 19, 2001; Amano Tatsuji.
Schroder et al; "Nanostructure and Optical Properties of Fluoride Films for High-Quality DUV/VUV Optical Components"; Proc. of SPIE vol. 5963 10 Pages.
Liu et al; "Microstructure-Related Properties at 193 NM of MgF2 and GdF3 Films Deposited by a Resistive-Heating Boat"; Applied Optics, vol. 45, No. 7 Mar. 1, 2006, p. 1368-1374.

\* cited by examiner

*Primary Examiner* — Stephone Allen
*Assistant Examiner* — Kimberly N Kakalec
(74) *Attorney, Agent, or Firm* — Walter M. Douglas

(57) ABSTRACT

The invention is directed to optical elements that are coated with dense homogeneous fluoride films and to a method of making such coated elements. The coatings materials are a high ("H") refractive index fluoride material and a low ("L") refractive index material that are co-evaporated to form a coating layer of a L-H coating material (a co-deposited coating of L and H materials). Lanthanide metal fluorides (for example, neodymium, lanthanum, dysprosium, yttrium and gadolinium, and combinations thereof) are preferred metal fluorides for use as the high refractive index materials with lanthanum fluoride ($LaF_3$) and gadolinium fluoride ($GdF_3$) being particularly preferred. Aluminum fluoride ($AlF_3$) and alkaline earth metal fluorides (fluorides of calcium, magnesium, barium and strontium) are the preferred low refractive index materials, with magnesium fluoride ($MgF_2$) being a preferred alkaline earth metal fluoride.

12 Claims, 6 Drawing Sheets

DENSE HOMOGENEOUS FLUORIDE FILMS FOR DUV ELEMENTS AND METHOD OF PREPARING SAME

CROSS-REFERENCE TO RELATED APPLICATIONS

This application claims the benefit of priority under 35 U.S.C. §119(e) of U.S. Provisional Application Ser. No. 61/004,784 filed on Nov. 30, 2007.

FIELD

The invention is directed to coated surfaces and elements, for example, mirrors, for use in laser systems, and in particular to elements surfaces simultaneously coated by co-deposition with a coating of a high refractive index material and a low refractive index material for use with below 200 nm laser systems such as ArF lasers.

BACKGROUND

ArF excimer laser based microlithography has been extensively used by the semiconductor industry to mass-produce patterned silicon wafers. The industry constantly demands more performance from excimer laser sources. As a result, greater demands are constantly places on excimer laser optical components, for example, the highly reflective mirrors that are used in 193 nm wavelength excimer lasers that at high repetition rates.

As semiconductor processing has progressed from the 65 nm to the 45 nm node and beyond, the application of optical coatings in the spectral regime of deep ultraviolet (DUV) has been extended and is now used for laser optics (the optical components used in connection with excimer laser based systems; for example, the highly reflective mirrors that are used in 193 nm wavelength excimer lasers that at high repetition rates) and precision optics (for example, the reticle inspection objective). Regarding laser optics, the optical components are exposed to high laser fluence. As a result, laser durability of laser optics is one of the main challenges to the industry. For precision optics, on the other hand, an objective or projection system comprises many lenses with various surface curvatures, and low-loss antireflection (AR) coatings are of extreme importance for such application. Generally, at least one high refractive index and one low refractive index fluoride material are required for making 193 nm optical coatings.

Among the very limited number of materials that can be used for such mirrors, $GdF_3$ and $LaF_3$ are considered as high refractive index materials and $MgF_2$ and $AlF_3$ are the low refractive index materials that are used for wavelengths below 200 nm. [See D. Ristau et al., "Ultraviolet optical and microstructural properties of $MgF_2$ and $LaF_3$ coating deposited by ion-beam sputtering and boat and electron-beam evaporation", *Applied Optics* 41, 3196-3204 (2002); R. Thielsch et al., "Development of mechanical stress in fluoride multilayers for UV-applications", Proc. *SPIE* 5250, 127-136 (2004); C. C. Lee et al., "Characterization of $AlF_3$ thin films at 193 nm by thermal evaporation", Applied Optics 44, 7333-7338 (2005); R. Thielsch et al, "Optical, structural and mechanical properties of gadolinium tri-fluoride thin films grown on amorphous substrates", Proc. *SPIE* 5963, 5963001-12 (2005); and Jue Wang et al, "Nano-structure of $GdF_3$ thin film evaluated by variable angle spectroscopic ellipsometry", Proc. SPIE 6321, p 6321071-10 (2006)].

At the present time there is renewed research interest in wide band-gap fluoride thin films for ArF laser optics applications. The application of energetic deposition processes, such as plasma ion-assisted deposition (PIAD), ion assisted deposition (IAD) and ion beam sputtering (IBS), are restricted for fluoride materials because of the nature of fluoride materials. As a result, the industry has accepted thermal resistance evaporation (TRE) for fluoride film deposition without introducing fluorine depletion. However, when thermal resistance evaporation is used as the film deposition method, the resulting fluoride film packing density is low (that is, it is porous) and the film structure is inhomogeneous. Neither of these is desirable because a porous structure can harbor environmental contamination and increases scatter losses. Various approaches have been applied to improve fluoride film structure, including substrate temperature and deposition rate. Recently, the effect of substrate crystal orientation has also been taken into account, but no significant improvements have been reported. [see Y. Taki and K. Muramatsu, "Hetero-epitaxial growth and optical properties of $LaF_3$ on $CaF_2$", Thin Solid Films 420-421, 30-37 (2002), and US patent 200302276670 A1 to Y. Taki et al., titled "Optical Element Equipped with Lanthanum Fluoride Film"].

Another problem arises from the fact that many periods of high index and low index layers (one period equals one high and one low refractive index layer) are required in order to get high reflectivity at 193 nm, for example, in highly reflective mirrors. However, the surface/interface roughness and inhomogeneity increase as number of layers and the overall thickness increases. The control of the multilayer fluoride film structure is critical for achieving high reflectivity at 193 nm. In addition to their use in microlithography, fluoride coated mirrors are also required for those areas where ArF excimer laser have other, non-lithographic application, for example minimal invasive brain-, vascular- and eye surgery; ultra-precision machining and measurement; large-scale integrated electronic devices; and components for communication. In view of the problems extant with the present fluoride coated elements (for example, mirrors and other laser system optical elements) that are used in below 200 nm, for example, 193 nm, lithography, it is desirable to have fluoride coated elements that overcome these problems. In addition to mirrors, the invention can also be applied to beamsplitters, prisms, lenses, output couplers and similar elements used in <200 nm laser systems.

SUMMARY

The invention is directed to optical elements that are coated with dense homogeneous fluoride films and to a method of making such coated elements. The coatings materials are a high ("H") refractive index fluoride material and a low ("L") refractive index material that are co-evaporated to form a coating layer of a L-H mixed coating material (a co-deposited coating of L-H materials). Lanthanide metal fluorides are preferred metal fluorides for use as the high refractive index materials with lanthanum fluoride ($LaF_3$) and gadolinium fluoride ($GdF_3$) being particularly preferred. Aluminum fluoride ($AlF_3$) and alkaline earth metal fluorides are the preferred low refractive index materials, with magnesium fluoride ($MgF_2$) being a preferred alkaline earth metal fluoride. The optical elements of the invention have one or a plurality of layers of co-deposited L-H films deposited on a selected substrate, each layer having a thickness in the range of 5-70 nm. The low index material in the co-deposited film(s) is present in the range of 2-30 wt. %, the remainder being the high index materials which is present in an amount in the range of 70-98 wt. %. The selected substrates are from the group of Si (silicon), $SiO_2$ (silica), fused $SiO_2$, HPFS™ (high purity fused silica from Corning Incorporated), F—$SiO_2$ (fluorine doped fused silica), the (111) plane of $CaF_2$ single crystals and a non-(111) plane of $CaF_2$ single crystals, the latter two being indicated herein as (111) $CaF_2$ single crystals and a non-(111) $CaF_2$ In one aspect of the invention the co-deposited films are $AlF_3$—$GdF_3$, $AlF_3$—$LaF_3$ deposited on a substrate, the substrate being selected from the group of $SiO_2$, fused $SiO_2$, HPFS™ (high purity fused silica from Corning Incorporated), F—$SiO_2$ (fluorine doped fused silica), (111) $CaF_2$ and non-(111) $CaF_2$.

In another aspect of the invention the optical element has a layer of a low index material L deposited on the substrate prior to the deposition of one or a plurality of co-deposited L-H layers of material. The thickness of the co-deposited L-H layers is in the range of 5-70 nm. The thickness of the L (only) layer, whether deposited on the substrate (optical element) before application of the co-deposited L-H layer or on top of a co-deposited L-H layer, is in the range of 5-70 nm. In a further aspect the low index material is selected from the group of $AlF_3$ and $MgF_2$. In an additional aspect a layer of low index material is deposited on top of each either co-deposited L-H layer or a stack consisting of a plurality of L-H layers. In yet another aspect a top or sealing layer of a material selected from the group consisting of silica, fused silica, high purity fused silica and fluorine-doped fused silica is deposited as the last layer on top of an L-H layer or a stack of L/(L-H) layers. In addition, one or a plurality of interfacial smoothing layers of a material selected from the group consisting of silica, fused silica, high purity fused silica and fluorine-doped fused silica are inserted between stacks of L/(L-H) layers.

In a further aspect the invention is directed to an optical element having a L-H layer deposited on the optical element and an L layer deposited on top of the L-H layer.

In one aspect the invention is directed to a method consisting of the co-evaporation of $AlF_3$ and a high index metal fluoride material, the $AlF_3$ being used for controlling high refractive index fluoride materials; for example, the film structure of $LaF_3$. $GdF_3$ and other high refractive index films.

A method of coating an optical element to form a coated optical element, said method comprising:
  providing an optical element;
  coating said optical element to have at least one coating stack by:
   (a) co-deposition of at least one film layer consisting of a high refractive index lanthanum group metal fluoride and a low refractive index metal fluoride to form an L-H layer, and
   (b) coating said co-deposited film layer with a coating of a low refractive index material to form an L layer;
  wherein said layers (a) and (b) each, independently of each other, have s a thickness in the range of range of 5 nm to 70 nm, and the L-H layer of (a) and the L layer (b) together for a stack.

DETAILED DESCRIPTION

Figure 1:
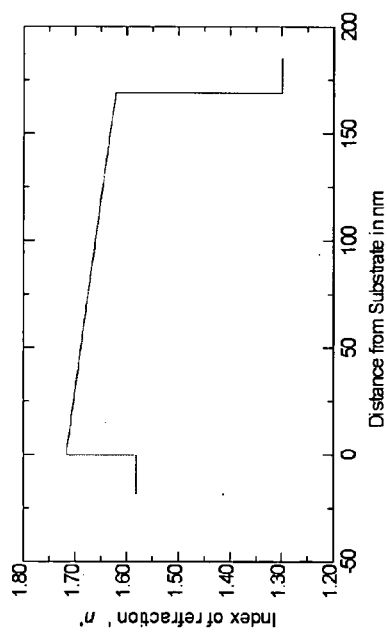
FIG. 1 illustrates the refractive index depth profile of a $GdF_3$ film grown on a $SiO_2$ substrate.

The invention is directed to optical elements (also called substrate) that are coated with dense homogeneous fluoride films and to a method of making such coated elements. The coatings materials are a high ("H") refractive index fluoride material and a low ("L") refractive index material that are co-evaporated to form a coating layer of a L-H mixture (an L-H layer, a co-deposited coating of L and H materials). Lanthanide metal fluorides (for example, neodymium, lanthanum, dysprosium, yttrium and gadolinium, and combinations thereof) are preferred metal fluorides for use as the high refractive index materials with lanthanum fluoride ($LaF_3$) and gadolinium fluoride ($GdF_3$) being particularly preferred. Aluminum fluoride ($AlF_3$) and alkaline earth metal fluorides (fluorides of calcium, magnesium, barium and strontium) are the preferred low refractive index materials, with magnesium fluoride ($MgF_2$) being a preferred alkaline earth metal fluoride. High index materials have an index of refraction in the range of 1.55-1.75. Low index materials have an index of refraction in the range of 1.35-1.45.

As may be used herein, the term "period" refers to an L/(L-H) layer pair. The term "stack" represents a multiple fluoride layers. Multiple periods can be applied to the substrate to form the coated optical element. Further, a layer of a low index material can be applied to the substrate prior to co-deposition of the coating with a L-H layer which is followed by deposition of an L layer to form a single period or the first of a plurality of periods. When a plurality of L/(L-H) periods are applied to the substrate to form a completed fluoride stack, an optional "smoothing layer," as described elsewhere herein, can be applied between two or more of the fluoride stacks. In addition, as also described elsewhere herein, in all embodiment of the invention an optional sealing layer can be applied as the last layer. Further, as used herein the terms "homogeneous, co-deposited L-H layer," "co-deposited layer," "coating layer of a mixed L-H coating material," "a co-deposited coating of L and H materials," "co-deposited L-H films" and similar terms means that the L-H layer or film consists of an L coating material and the H coating material that have been co-evaporated to form a single homogeneous layer or film having a specified composition on a substrate. The composition of such co-deposited layer or film is one that contains the low refractive index (L) metal fluoride material in the range of 2-30 wt % and the high refractive index (H) material in range or 70-98 wt % as indicated in the Summary.

The optical elements of the invention have one or a plurality of layers of co-deposited L-H film deposited on a selected substrate, each layer having a thickness in the range of 5-70 nm. The low index material in the co-deposited film(s) is present in the range of 2-30%, the remainder being the high index material(s). The selected substrates are from the group of Si (silicon), $SiO_2$ (silica), fused $SiO_2$, HPFS™ (high purity fused silica from Corning Incorporated), F—$SiO_2$ (fluorine doped fused silica), the (111) plane of $CaF_2$ single crystals and a non-(111) plane of $CaF_2$ single crystals, the latter two being indicated herein as (111) $CaF_2$ single crystals and a non-(111) $CaF_2$. The co-deposited films can be deposited by methods known in the art; for example, plasma ion-assisted deposition (PIAD), ion-assisted deposition (IAD), ion-beam sputtering (IBS) and thermal resistance evaporation (TRE). The preferred method of deposition is TRE.

In general, at least two fluoride materials with different refractive indices are required to obtain an optically functional coating on the surface of a bulk substrate. The coating include, for example, antireflection (AR) coatings, coatings that form partial reflectors (PR) and coating that form high reflectors or mirrors (HR). Partial reflectors reflect part of the incident light striking the coated element and allow part of the incident light to pass through the element. High reflectors (mirrors) reflect all or substantially all of the incident light. As described above, the materials $GdF_3$ and $LaF_3$, when deposited as layers on a substrate, are considered as high refractive index layers, and the materials $AlF_3$ and $MgF_2$, when deposited as layers on a substrate, are considered as low refractive index layers. Among these materials $AlF_3$ is amorphous. [Films of $SiO_2$ are also amorphous]. However, $LaF_3$, $GdF_3$ and $MgF_2$ films are crystalline in nature and there are different crystalline structures for each depending on film growth conditions. The overall performance of fluoride coated elements relates to the pair of fluoride materials that are selected (for example, $GdF_3$/$AlF_3$, $GdF_3$/$MgF_2$, $LaF_3$/$AlF_3$ and $LaF_3$/$MgF_2$), the type of substrates (for example, $SiO_2$ and $CaF_2$) and the substrate crystal orientation (for example, a (111) $CaF_2$ substrate surface or a non-(111) $CaF_2$ substrate surface). It has been also observed that the microstructure of high refractive index fluoride layers (for example, $LaF_3$ and $GdF_3$ layers) has more impact to the performance of optical elements than the low refractive index fluoride layers (for example, $MgF_2$ and $AlF_3$). In other words, structural control of high refractive index fluoride layers is critical for improving performance of optical elements. As a result, effort has been made to control the structure of $LaF_3$ layers [Y. Taki et al., "*Hetero-epitaxial growth and optical properties of $LaF_3$ on $CaF_2$*," Thin Solid Films, Vol. 420-421 (2002), pages 30-37; and U.S. Patent Application Publication No. 2003/0227670 A1]; $GdF_3$ layers [J. Wang et al, "Nanoporous structure of a $GdF_3$ thin film evaluated by variable angle spectroscopic ellipsometry," Applied Optics, Vol. 46, No. 16, pages 3221-3226; and J Wang et al, "*Challenge of fluoride coatings,*" presented at the International Conference on Optical Coating Technology and Applications, Suzou, China, May 8-10, 2007]; and to smooth stacks of fluoride coatings.

Generally, at least one high refractive index (for example, $GdF_3$ and $LaF_3$) and one low refractive index (for example, $AlF_3$ and $MgF_2$) fluoride materials are required for making 193 nm optical coatings. Except for $AlF_3$, most of the commonly used fluorides prefer to form crystal structures during film growth. The result obtaining during the course of making the present invention indicates that $AlF_3$/$GdF_3$ is the best L/H fluoride combination among $AlF_3$/$LaF_3$, $MgF_2$/$GdF_3$ and $MgF_2$/$LaF_3$. Heteroepitaxial growth behavior of $GdF_3$ on $CaF_2$ (111) surface enables us to improve the $GdF_3$ film structure for laser optics applications, where in most cases fluoride films are deposited on $CaF_2$ (111) surface. For precision optics applications the fluoride films have to be deposited on a non-(111) $CaF_2$ surface or in an amorphous $SiO_2$ substrate.

Figure 2:
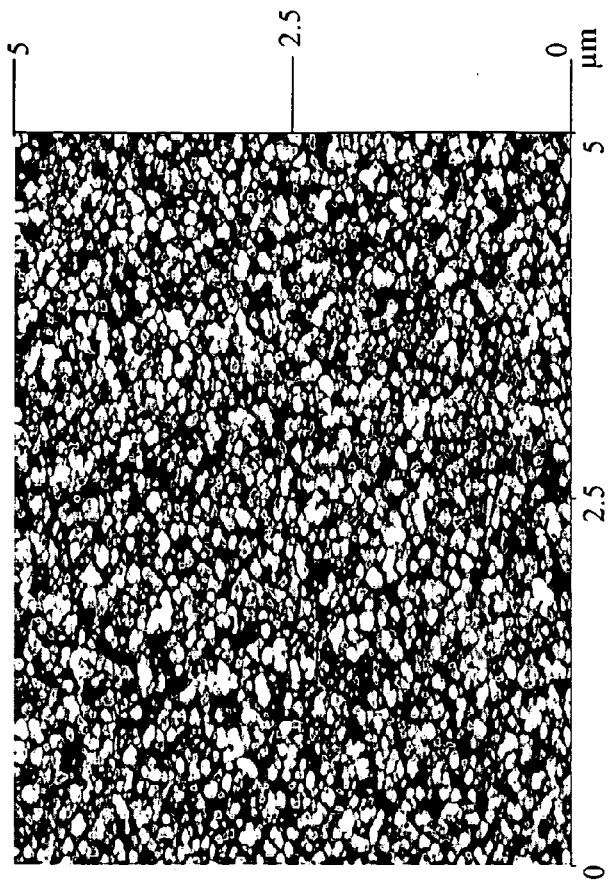
FIG. 2 is an AFM image of a $GdF_3$ film grown on a $SiO_2$ substrate.

FIG. 1 shows the refractive index depth profile (at 193 nm wavelength) of a $GdF_3$ film grown on $SiO_2$ substrate. The index of refraction is proportional to film packing density; that is, a high refractive index originates from a dense film, whereas low refractive index corresponds to a porous film structure. As can be seen in FIG. 1, at the beginning of the $GdF_3$ film growth, a dense film is formed on the substrate, leading to a high refractive index. As film thickness increases, the randomly orientated crystalline microstructure introduces gaps between crystal grains. As a consequence of the gaps the film density decreases, as the layer thickness increases (distance from substrate), ending with very rough layer surface. The rough surface morphology is further confirmed by the AFM (atomic force microscopy) measurements as shown in FIG. 2.

Figure 3:
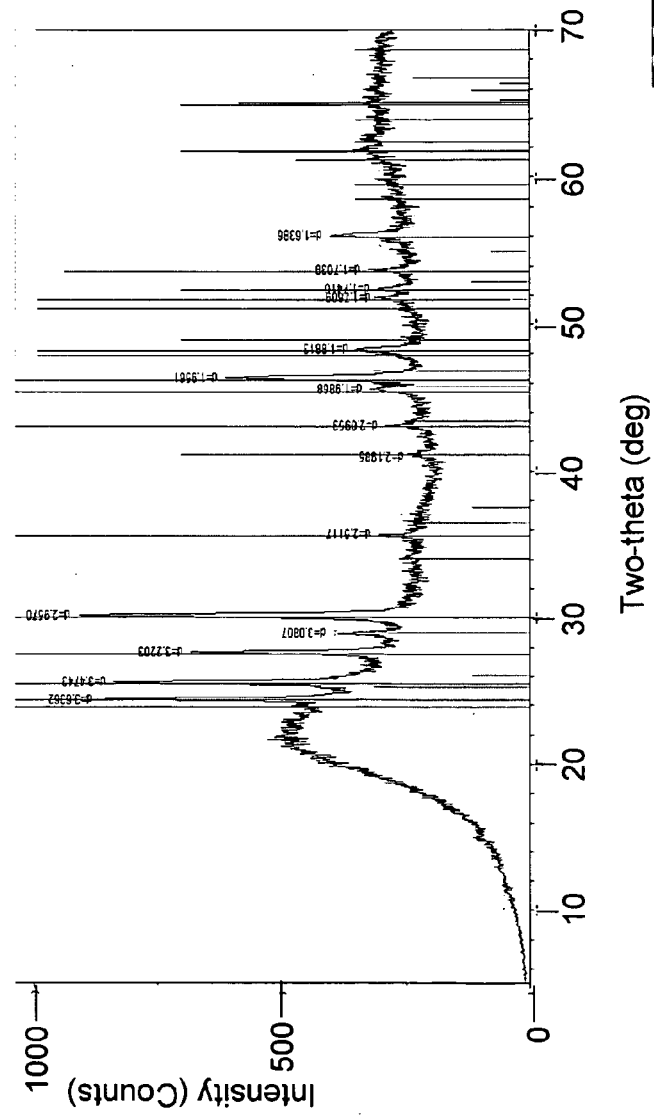
FIG. 3 is an XRD image of a $GdF_3$ film grown on a $SiO_2$ substrate.
Figure 4:
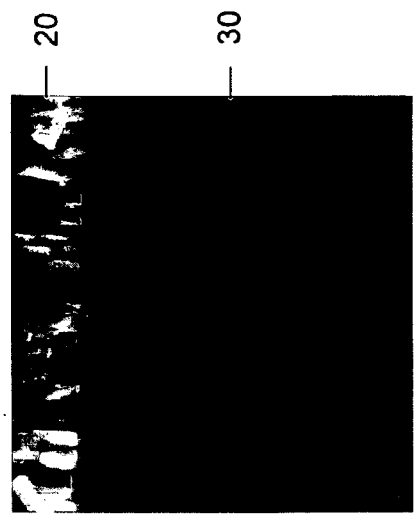
FIG. 4 is illustrates the SEM cross-section of a $GdF_3$ film grown on a $SiO_2$ substrate.

The surface roughness in RMS (root-mean-square) is 9.1 nm over a 5 μm×5 μm area. FIG. 3 depicts the X-ray diffraction (XRD) image of a $GdF_3$ film grown on a $SiO_2$ substrate. The crystalline structure (the XRD sharp spikes or peaks) overlaps with the amorphous background originating from the $SiO_2$ substrate. The XRD peaks indicate almost randomly oriented polycrystalline $GdF_3$ film on the $SiO_2$ substrate. This polycrystalline structure is also revealed by scanning electron microscope (SEM) cross-sectional image as shown in FIG. 4, the $GdF_3$ layer being represented by numeral 20 and the $SiO_2$ substrate being represented by numeral 30. Inhomogeneous film structure and rough surface of $GdF_3$ films grown on non-(111) $CaF_2$ substrates and amorphous $SiO_2$ substrates increase scatter loss and raise the risk of contamination (by contaminate material filling the gaps in the surface of the film). This leads to, for example, reduced fluoride (AR) coating performance for the precision optics applications.

Figure 6:
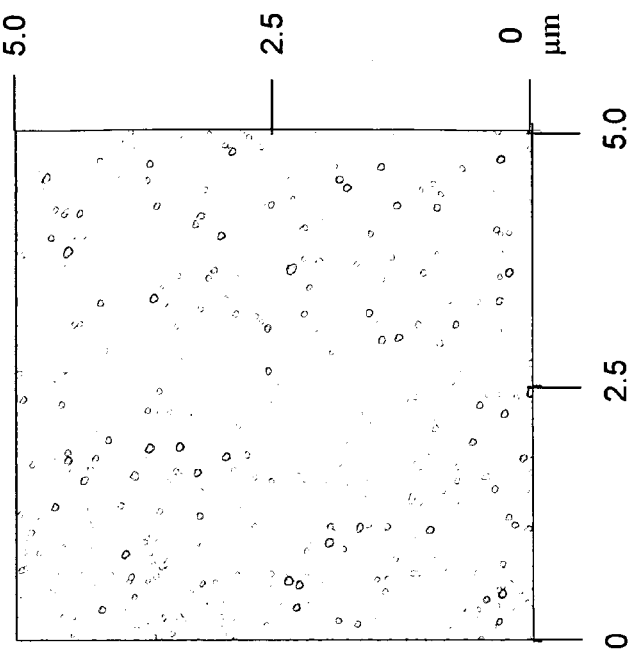
FIG. 6 AFM images of $AlF_3$—$GdF_3$ co-evaporated film on $SiO_2$ substrate
Figure 5:
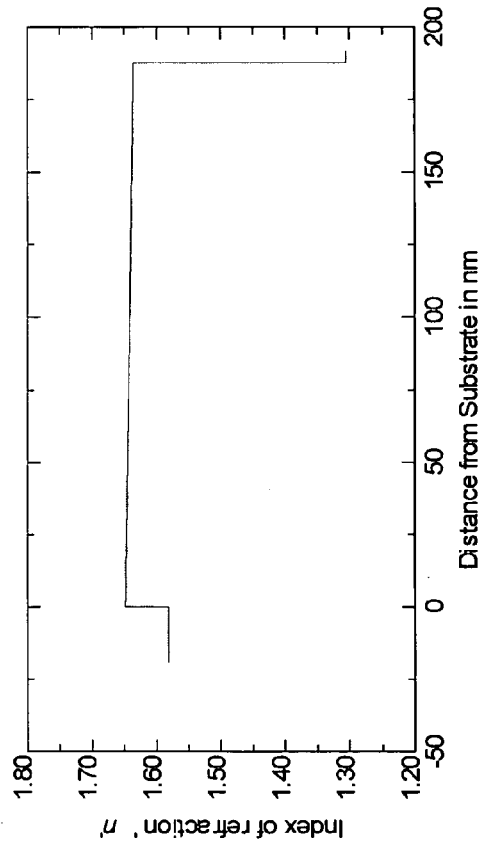
FIG. 5 illustrates the refractive index depth profile of $AlF_3$—$GdF_3$ co-evaporated film on a $SiO_2$ substrate.

In accordance with the invention, in order to decrease scatter loss and minimize the risk of contamination a co-deposition technique is used to control $GdF_3$ crystal growth size and to fill the voids between $GdF_3$ crystal grains with amorphous $AlF_3$. The idea has been confirmed experimentally and is illustrated in FIG. 5 which shows the refractive index (at 193 nm wavelength) depth profile of $AlF_3$/$GdF_3$ co-deposited film on $SiO_2$ substrate. The film composition is 90% $GdF_3$ and 10% $AlF_3$. The total layer thickness is very close to the $GdF_3$ film shown in FIG. 1. In comparison to the to $GdF_3$ film of FIG. 1, the inhomogeneity of the co-deposited $AlF_3$—$GdF_3$ film is significantly reduced. The surface of the co-deposited $AlF_3$—$GdF_3$ film is also smoother than the $GdF_3$ only film as shown by a comparison of the right side of the refractive index profiles in FIG. 5 and FIG. 1, respectively. The co-deposited film morphology is illustrated by the AFM image of FIG. 6. The difference between FIG. 6 and FIG. 2 is very clear. The co-evaporated $AlF_3$ breaks the $GdF_3$ crystal structure and fills the voids between $GdF_3$ crystal grains. As a result, only small $GdF_3$ crystal grains can be formed and the co-deposited $AlF_3/GdF_3$ film is dense, homogeneous and smooth. The surface roughness of the co-evaporated film of FIG. 6, as measured by AFM, is 1.2 nm, which is 7.6-fold less than the roughness of $GdF_3$ film of FIG. 2. The advantage of using the co-evaporation technique to control fluoride film structure has also been demonstrated in the development of AR coating(s) on non-(111) $CaF_2$ lenses and amorphous $SiO_2$ lenses with strong surface curvatures.

Figure 7:
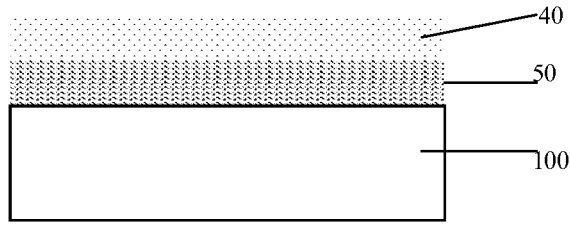
FIG. 7 illustrates a 2-layer AR coating having a first layer coating of a co-evaporated $AlF_3$—$GdF_3$ on a $SiO_2$ or $CaF_2$ substrate and a second layer coating of and $AlF_3$ overlying the co-evaporated $AlF_3$—$GdF_3$ layer.
Figure 8:
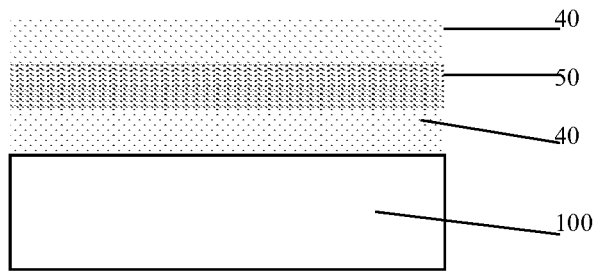
FIG. 8 illustrates 3-layer AR coating in which the first coating layer is $AlF_3$ that is deposited on a $SiO_2$ or $CaF_2$ substrate, a second coating layer in which the coating material is a co-evaporated $AlF_3$—$GdF_3$ that deposited on top of the first coating layer and a third coating layer that is $AlF_3$ deposited on top of the co-evaporated $AlF_3$—$GdF_3$.
Figure 9:
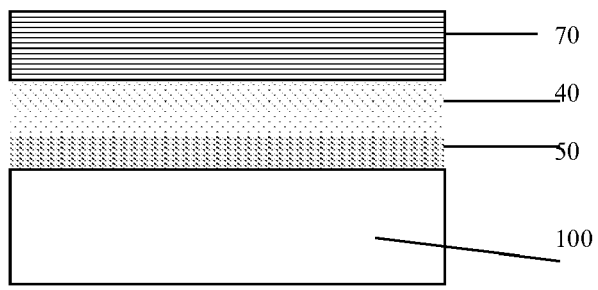
FIG. 9 illustrates the 2-layer coating of FIG. 7 with an optional "top sealant" applied on top of the second coating layer.
Figure 10:
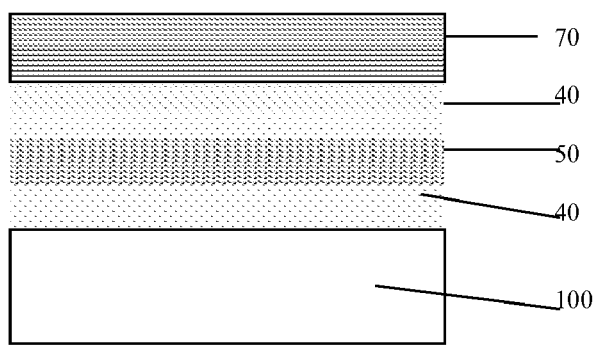
FIG. 10 illustrates the 3-layer coating of FIG. 8 with an optional "top sealant" applied on top of the third coating layer.

Examples, without limitation, of the some applications of the invention are schematically shown in FIGS. 7-10. FIG. 7 illustrates a 2-layer AR coating using a fluoride pair of layers, one layer being a co-deposited $AlF_3$—$GdF_3$ layer 50 and the other layer being an $AlF_3$ layer 40, on a $SiO_2$ or $CaF_2$ substrate 100. FIG. 8 illustrates a 3-layer AR coating using a fluoride pair of layers consisting of a co-deposited $AlF_3$—$GdF_3$ layer 50 on top of an $AlF_3$ layer 40 on a $SiO_2$ or $CaF_2$ substrate 100, and a top $AlF_3$ layer over the $AlF_3$—$GdF_3$ layer 50. FIG. 9 illustrates the 2-layer coating of FIG. 7 with a top sealant layer 70 (discussed in the following paragraph) on top of the low index $AlF_3$ layer 40. FIG. 10 illustrates the 3-layer coating of FIG. 8 with a top sealant layer 70. It is to be understood that the high index and low index materials used in the foregoing coating can be replaced by other high index or low index materials as have been described herein.

The approach of using top sealant (numeral 70 in FIGS. 9-10) has been disclosed in commonly assigned U.S. Provisional Application No. 60/904,132, where a dense smooth $SiO_2$ (silica, fused silica and high purity fused silica), or F—$SiO_2$ layer is used as the sealant. The co-evaporated $AlF_3$—$GdF_3$ layer shown in FIGS. 7-10 can be replaced by co-evaporated $AlF_3$—$LaF_3$ layer. The $AlF_3$ layers shown in FIG. 7-10 can be also replaced by co-evaporated $AlF_3$—$MgF_2$ layers. The layer thickness of the co-evaporated film ranges from 5 nm to 70 nm.

Figure 11:
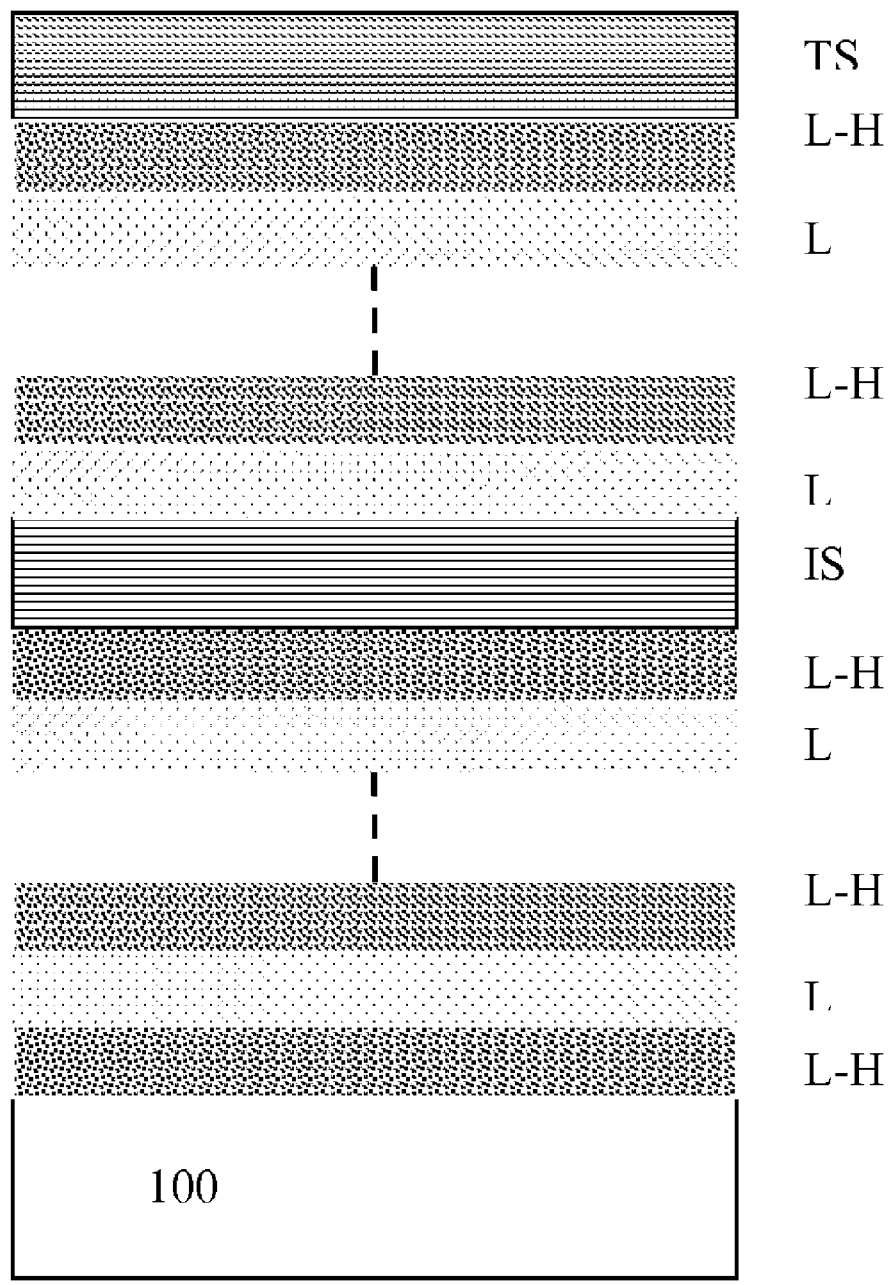
FIG. 11 is a schematic illustrating AR, PR and HR coatings using a fluoride stack of L/(L-H) on a $SiO_2$ or $CaF_2$ substrate with at least one interfacial smoothing ("IS") layers and a top sealant ("TS").

In general, the co-evaporation approach for fluoride film structural control can be applied to any fluoride related AR (antireflection), PR (partial reflector) and HR (high reflector or mirror) coatings. FIG. 11 shows a schematic of AR, PR and HR coatings using a fluoride pair of co-deposited L-H and L layers on a $SiO_2$ or $CaF_2$ substrate with interfacial smoothing (IS) layers and a top sealant (TS) layer. Label L-H represents a layer of co-evaporated $AlF_3$—$GdF_3$ or $AlF_3$—$LaF_3$. Label L represents a layer of $AlF_3$ or co-evaporated $AlF_3$—$MgF_2$. The layer sequence in FIG. 11 can be set in different orders depending upon coating designs. In addition, it is to be understood that the high index and low index materials used in the foregoing coating can be replaced by other high index or low index materials as have been described herein.

Figure 12:
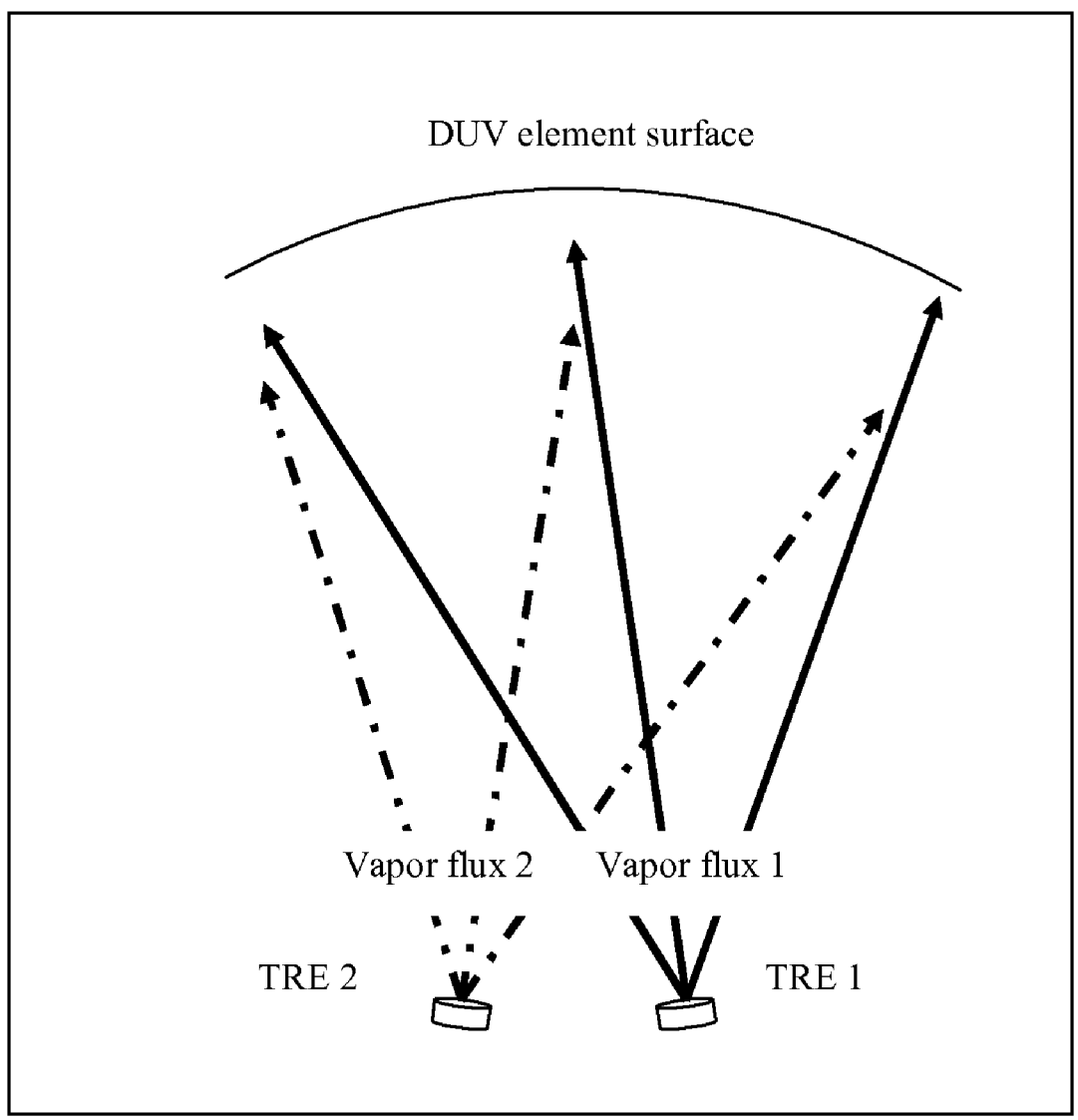
FIG. 12 schematically illustrates the setup of a co-evaporated process in a high vacuum chamber, where the DUV elements to be coated are located at the top and the TRE 1 and TRE 2 at the bottom. The TRE 1 and TRE 2 are used for evaporating high purity fluoride materials. The weight percentage of co-evaporated L in the H matrix is determined by the vapor flux ratio.

FIG. 12 schematically illustrates the setup of a co-evaporated process in a high vacuum chamber, where the DUV elements to be coated are located at the top and the TRE 1 and TRE 2 at the bottom. The TRE 1 and TRE 2 are used for evaporating high purity fluoride materials being placed in the separated thermal resistance sources made of molybdenum (Mo) or platinum (Pt) in boat shape. The weight percentage of the co-evaporated L in the H matrix is determined by the related vapor flux ratio, which is controlled by the amount of current passing through the boats. For example, the boat TRE 1 can contain the high index material and the boat TRE 2 can contain the low index material. The vapor flux can be in-situ monitored by means of quartz-crystal monitor or optical techniques. D. L. Smith described the technical detail of thermal resistance evaporation in chapter 4 of "Thin-Film Deposition: Principles & Practice," McGraw-Hill, Inc. (1995).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. A coated optical element, said optical element comprising a substrate having at least one homogeneous, co-deposited L-H layer consisting of a high refractive index lanthanum group metal fluoride material and a low refractive index metal fluoride material deposited on said substrate, and a L layer of a low refractive index metal fluoride material deposited on top of said co-deposited L-H layer.

2. The coated optical element according to claim 1, wherein the metal in the high refractive index lanthanum group metal fluoride is selected from the group consisting of neodymium, lanthanum, dysprosium, yttrium and gadolinium.

3. The coated optical element according to claim 1, wherein the metal in the high refractive index lanthanum group metal fluoride is selected from the group consisting of lanthanum and gadolinium.

4. The coated optical element according to claim 1, wherein the metal selected in the low refractive index metal fluoride is selected from the group consisting of aluminum fluoride and the fluorides of calcium, magnesium, barium and strontium.

5. The coated optical element according to claim 1, wherein the metal selected in the low refractive index metal fluoride is selected from the group consisting of aluminum fluoride and magnesium fluoride.

6. The coated optical element according to claim 1, wherein the substrate is selected from the group consisting of silica, fused silica, high purity fused silica and a calcium fluoride single crystal substrate.

7. The coated optical element according to claim 1, wherein the substrate is selected from the group consisting of high purity fused silica and calcium fluoride.

8. The optical element according to claim 1, wherein said optical element further comprises a sealing layer applied as the last layer on top of the coated optical element, said sealing layer being selected from the group consisting of silica, fused silica, high purity fused silica and fluorine-doped fused silica and having a thickness in the range of 5-70 nm.

9. The optical element according to claim 1, wherein, said optical element comprises a plurality of L/(L-H) layer pairs, and,
    optionally, at least one interfacial smoothing layer inserted in-between at least one pair of the stacks, said smoothing layer being selected from the group consisting of silica, fused silica, high purity fused silica and fluorine-doped fused silica.

10. The coated optical element according to claim 1, wherein the co-deposited layer consists of 2-30 wt. % low refractive index metal fluoride and 70-98 wt. % high refractive index material.

11. The coated optical element according to claim 1, wherein the co-deposited L-H layer has a thickness in the range of 5 nm to 70 nm.

12. The coated optical element according to claim 1, wherein the L layer has a thickness in the range of 5 nm to 70 nm.

* * * * *